(12) United States Patent
Kishimoto

(10) Patent No.: US 11,738,993 B2
(45) Date of Patent: Aug. 29, 2023

(54) SILICON SUBSTRATE HAVING CAVITY AND CAVITY SOI SUBSTRATE INCLUDING THE SILICON SUBSTRATE

(71) Applicant: Murata Manufacturing Co., Ltd., Nagaokakyo (JP)

(72) Inventor: Yutaka Kishimoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 230 days.

(21) Appl. No.: 17/332,167

(22) Filed: May 27, 2021

(65) Prior Publication Data

US 2021/0284524 A1  Sep. 16, 2021

Related U.S. Application Data

(63) Continuation of application No. PCT/JP2019/047841, filed on Dec. 6, 2019.

(30) Foreign Application Priority Data

Jan. 16, 2019 (JP) ................. 2019-005521

(51) Int. Cl.
*B81B 1/00* (2006.01)
*B81C 1/00* (2006.01)

(52) U.S. Cl.
CPC .......... *B81B 1/002* (2013.01); *B81C 1/00047* (2013.01); *B81B 2203/0315* (2013.01); *B81C 2201/0132* (2013.01); *B81C 2203/036* (2013.01)

(58) Field of Classification Search
CPC ............ B81B 1/002; B81B 2203/0315; B81C 1/00047; B81C 2201/0132; B81C 2203/036; B81C 1/00666; H01L 21/02; H01L 27/12
See application file for complete search history.

(56) References Cited

U.S. PATENT DOCUMENTS

| | | | |
|---|---|---|---|
| 4,878,957 A | | 11/1989 | Yamaguhi et al. |
| 5,780,311 A | * | 7/1998 | Beasom .............. H01L 21/2007 438/455 |
| 6,465,271 B1 | | 10/2002 | Ko |
| 6,812,508 B2 | | 11/2004 | Fukumi |
| 2002/0063341 A1 | | 5/2002 | Fukumi |

(Continued)

FOREIGN PATENT DOCUMENTS

| | | |
|---|---|---|
| JP | H01315159 A | 12/1989 |
| JP | H05160090 A | 6/1993 |

(Continued)

OTHER PUBLICATIONS

International Search Report issued for PCT/JP2019/047841, dated Feb. 25, 2020.

(Continued)

*Primary Examiner* — Yasser A Abdelaziez
(74) *Attorney, Agent, or Firm* — ArentFox Schiff LLP

(57) ABSTRACT

A silicon substrate having a first silicon substrate having a first surface with a cavity and a second surface opposite the first surface; a first silicon oxide film having a thickness d1 on the first surface; a second silicon oxide film having a thickness d2 on a bottom of the cavity; and a third silicon oxide film having a thickness d3 on the second surface, where $d1 \leq d3$ and $d1 < d2$, or $d3 < d1$ and $d2 < d1$.

2 Claims, 8 Drawing Sheets

(56) References Cited

U.S. PATENT DOCUMENTS

2010/0112824 A1* 5/2010 Yokokawa ........ H01L 21/31662
  438/770
2015/0122038 A1* 5/2015 Mayer .................... H01L 21/76
  29/874

FOREIGN PATENT DOCUMENTS

| JP | H0917984 A | 1/1997 |
| JP | H0945882 A | 2/1997 |
| JP | 2004071939 A | 3/2004 |
| JP | 3957038 B2 | 8/2007 |
| JP | 2010153488 A | 7/2010 |
| JP | 2011071193 A | 4/2011 |
| JP | 2011176097 A | 9/2011 |
| JP | 2013160556 A | 8/2013 |
| JP | 2015123547 A | 7/2015 |
| JP | 2016201454 A | 12/2016 |

OTHER PUBLICATIONS

Written Opinion of the International Search Report issued for PCT/JP2019/047841, dated Feb. 25, 2020.

* cited by examiner

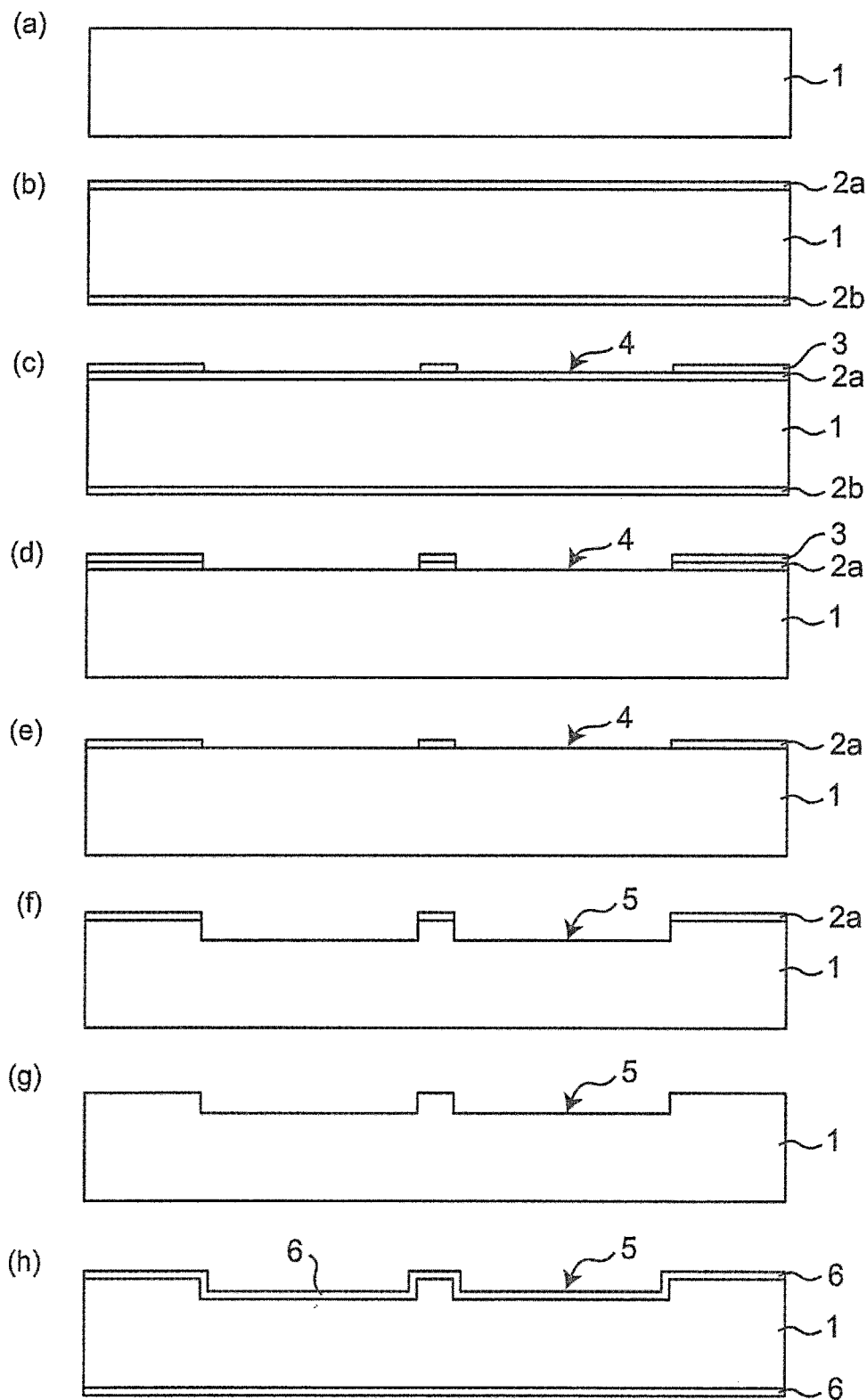

SILICON SUBSTRATE HAVING CAVITY AND CAVITY SOI SUBSTRATE INCLUDING THE SILICON SUBSTRATE

CROSS REFERENCE TO RELATED APPLICATIONS

The present application is a continuation of International application No. PCT/JP2019/047841, filed Dec. 6, 2019, which claims priority to Japanese Patent Application No. 2019-005521, filed Jan. 16, 2019, the entire contents of each of which are incorporated herein by reference.

FIELD OF THE INVENTION

The present invention relates to a silicon substrate having a cavity and included, for example, in microelectromechanical systems (MEMS) devices, and also relates to a cavity silicon-on-insulator (SOI) substrate including the silicon substrate. The present invention particularly relates to a cavity SOI substrate (C-SOI substrate) that includes a first silicon substrate having a cavity and a second silicon substrate bonded to the first silicon substrate by a silicon oxide film.

BACKGROUND OF THE INVENTION

MEMS devices in which a silicon substrate includes a piezoelectric element have been known. Examples of the MEMS devices include a cavity SOI substrate in which a first silicon substrate having a cavity and a second silicon substrate are bonded together. For example, there is disclosed a configuration in which, of two silicon substrates constituting a cavity SOI substrate, a first silicon substrate has a cavity and a second silicon substrate is bonded to the first silicon substrate, with a silicon oxide film ($SiO_2$) interposed therebetween (see, e.g., Patent Document 1).

Also, a technique is disclosed in which the thickness of a silicon oxide film ($SiO_2$) formed on the back surface of a silicon substrate, which is a handle wafer of a SOI substrate, is the same as or similar to the thickness of a silicon oxide film ($SiO_2$) formed on the front surface of the silicon substrate, which is the handle wafer, so that warpage of the SOI substrate is reduced (see, e.g., Patent Document 2).

Another technique is disclosed in which oxide films, each formed on one of two silicon substrates constituting a SOI substrate, have different thicknesses. Specifically, the oxide film on the silicon substrate to be formed into an active layer is thicker than the oxide film on the other silicon substrate, so that warpage of the SOI substrate is reduced (see, e.g., Patent Document 3).

Patent Document 1: Japanese Unexamined Patent Application Publication No. 2015-123547
Patent Document 2: Japanese Unexamined Patent Application Publication No. 2011-176097
Patent Document 3: Japanese Unexamined Patent Application Publication No. 9-45882

SUMMARY OF THE INVENTION

As described below, the present inventor found that in the cavity SOI substrate described in Patent Document 1, warpage occurs in the silicon substrate having a cavity.
The inventions disclosed in Patent Document 2 and Patent Document 3 both relate to a SOI substrate with no cavity. Although these inventions may reduce warpage of the SOI substrate, it may be difficult to reduce warpage of a cavity SOI substrate.

Accordingly, an object of the present invention is to provide a silicon substrate having a cavity that is less prone to warpage.

A silicon substrate according to an aspect of the present invention includes a first silicon substrate having a first surface with a cavity and a second surface opposite the first surface; a first silicon oxide film having a thickness $d1$ on the first surface; a second silicon oxide film having a thickness $d2$ on a bottom of the cavity; and a third silicon oxide film having a thickness $d3$ on the second surface, where $d1 \leq d3$ and $d1 < d2$, or $d3 < d1$ and $d2 < d1$.

A cavity SOI substrate according to an aspect of the present invention includes a first silicon substrate having a first surface with a cavity and a second surface opposite the first surface; a first silicon oxide film having a thickness $d1$ on the first surface; a second silicon oxide film having a thickness $d2$ on a bottom of the cavity; a third silicon oxide film having a thickness $d3$ on the second surface; and a second silicon substrate bonded to the first silicon substrate such that the first silicon oxide film is between the first silicon substrate and the second silicon substrate, where $d1 \leq d3$ and $d1 < d2$, or $d3 < d1$ and $d2 < d1$.

In the silicon substrate having a cavity and the cavity SOI substrate including the silicon substrate according to aspects of the present invention, warpage in the cavity SOI substrate is reduced.

BRIEF DESCRIPTION OF THE DRAWINGS

FIG. 5A is a schematic cross-sectional view illustrating steps of a method for manufacturing the cavity SOI substrate according to the first embodiment.

DETAILED DESCRIPTION OF THE PREFERRED EMBODIMENTS

A silicon substrate having a cavity according to a first aspect is a silicon substrate having a first surface with a cavity and a second surface opposite the first surface. The silicon substrate includes a first silicon oxide film having a thickness d1 and disposed on the first surface, a second silicon oxide film having a thickness d2 and disposed on a bottom of the cavity, and a third silicon oxide film having a thickness d3 and disposed on the second surface. The thicknesses d1, d2, and d3 satisfy a first set of relations, d1≤d3 and d1<d2, or a second set of relations, d3<d1 and d2<d1.

A cavity SOI substrate according to a second aspect includes the silicon substrate having a cavity according to the first aspect, and a silicon substrate bonded to the first surface of the silicon substrate having a cavity.

A cavity SOI substrate according to a third aspect includes a first silicon substrate having a first surface with a cavity and a second surface opposite the first surface, and a second silicon substrate bonded to the first surface of the first silicon substrate. The first silicon substrate includes a first silicon oxide film having a thickness d1 and disposed on the first surface, a second silicon oxide film having a thickness d2 and disposed on a bottom of the cavity, and a third silicon oxide film having a thickness d3 and disposed on the second surface. The thicknesses d1, d2, and d3 satisfy a first set of relations, d1≤d3 and d1<d2, or a second set of relations, d3<d1 and d2<d1.

BACKGROUND OF THE PRESENT INVENTION

The present inventor found that in a cavity SOI substrate (C-SOI substrate) that includes a first silicon substrate having a cavity and a second silicon substrate bonded to the first silicon, warpage occurs in the first silicon substrate having a cavity.

In the C-SOI substrate, the first silicon substrate and the second silicon substrate are bonded together, for example, by direct bonding called fusion bonding. Warpage in the C-SOI substrate is thought to occur (or develop) during formation of a thermal oxide film before fusion bonding, and also during heat treatment (annealing) after the fusion bonding. In the former case, the thermal oxide film is formed, for example, in an atmosphere containing oxygen at 1000° C. Warpage is thought not to occur in an atmosphere containing oxygen at 1000° C., but is thought to occur when the temperature returns to room temperature after formation of the thermal oxide film, due to a difference in thermal expansion coefficient between Si of the silicon substrate and $SiO_2$ of the thermal oxide film.

Figure 2A:
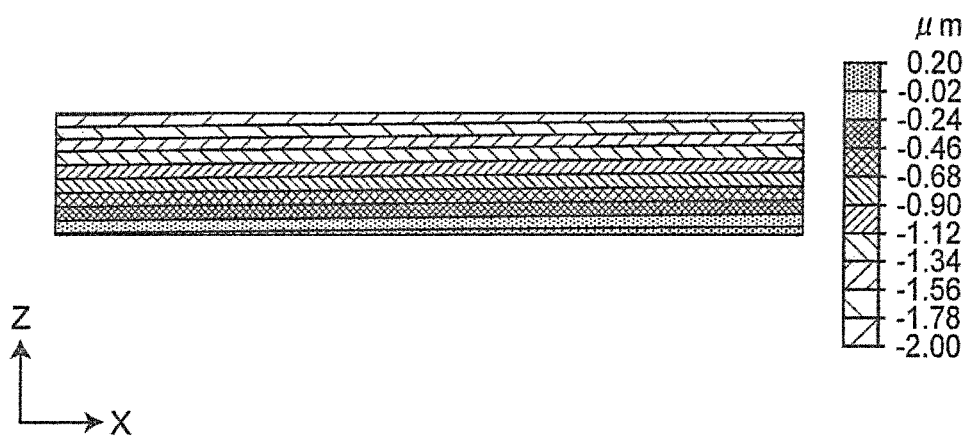
FIG. 2A shows a distribution of compressive stress values to simulate warpage during thermal oxidation of a planar silicon substrate.
Figure 2B:
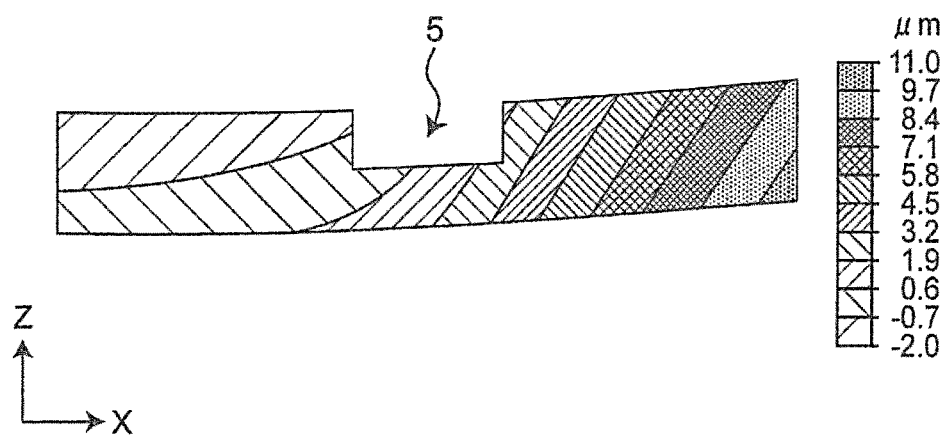
FIG. 2B shows a distribution of compressive stress values to simulate warpage during thermal oxidation of a silicon substrate having a cavity.

FIG. 2A shows a distribution of compressive stress values to simulate warpage during thermal oxidation of a planar silicon substrate. FIG. 2B shows a distribution of compressive stress values to simulate warpage during thermal oxidation of a silicon substrate having a cavity. The thermal oxidation is a process that forms a thermal oxide film before fusion bonding. Conditions for the simulation are listed below. Note that the drawings each illustrate warpage of the substrate secured at the left end.

Finite element method (FEM)
Axisymmetric model (rotational model)
Assume no stress at 1000° C. (thermal oxidation condition), and calculate warpage when temperature returns to room temperature (25° C.)
Diameter of silicon substrate: 150 mm
Thickness of silicon substrate: 600 μm
Depth of cavity: 300 μm
Normal thickness of thermal oxide film: 2 μm (d1)

FIG. 2A shows that in the planar silicon substrate, compressive stress on the lower side and tensile stress on the upper side are both small and do not cause warpage. In contrast, the silicon substrate having a cavity, illustrated in FIG. 2B, has a cavity 5. The silicon substrate having a cavity has a first surface and a second surface. The first surface has the cavity 5 and allows a second silicon substrate of the C-SOI substrate to be bonded thereto. The second surface is a surface opposite the first surface. In the silicon substrate having a cavity, the first surface, the bottom of the cavity 5, and the second surface each have a silicon oxide film thereon, and stress of these silicon oxide films is thought to contribute to warpage. For example, if the thickness d1 of the silicon oxide film on the first surface, the thickness d2 of the silicon oxide film on the bottom of the cavity 5, and the thickness d3 of the silicon oxide film on the second surface are equal (d1=d2=d3), the silicon substrate having a cavity warps significantly, as illustrated in FIG. 2B. Accordingly, the relation between warpage and the thicknesses d1, d2, and d3 of these silicon oxide films of the silicon substrate having a cavity was examined.

Note that since the thickness d1 of the silicon oxide film on the first surface affects the bonding strength between the first silicon substrate and the second silicon substrate in the C-SOI substrate, it is not desirable to change this thickness. Accordingly, only the thickness d2 of the silicon oxide film on the bottom of the cavity 5 and the thickness d3 of the silicon oxide film on the second surface were examined.

Figure 3A:
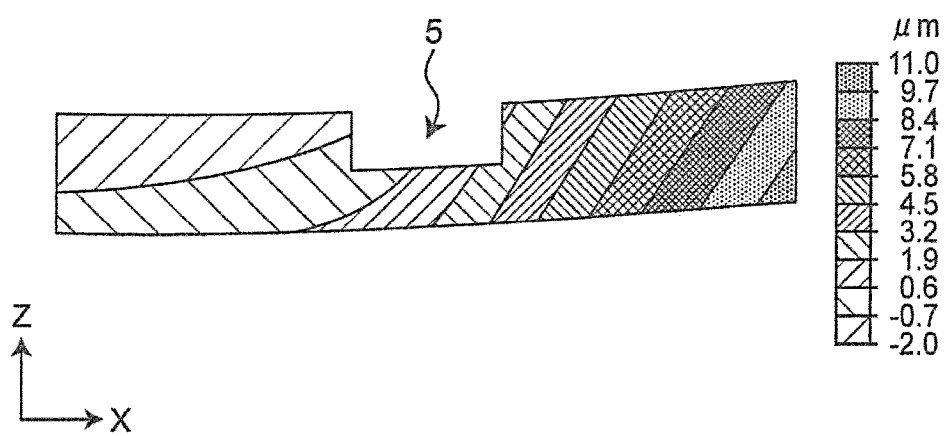
FIG. 3A shows a distribution of compressive stress values to simulate warpage during thermal oxidation under conditions where the thickness $d3$ of the silicon oxide film on the second surface is greater than or equal to the thickness $d1$ of the silicon oxide film on the first surface, and the thickness $d2$ of the silicon oxide film on the bottom of the cavity is equal to the thickness $d1$ of the silicon oxide film on the first surface.
Figure 3B:
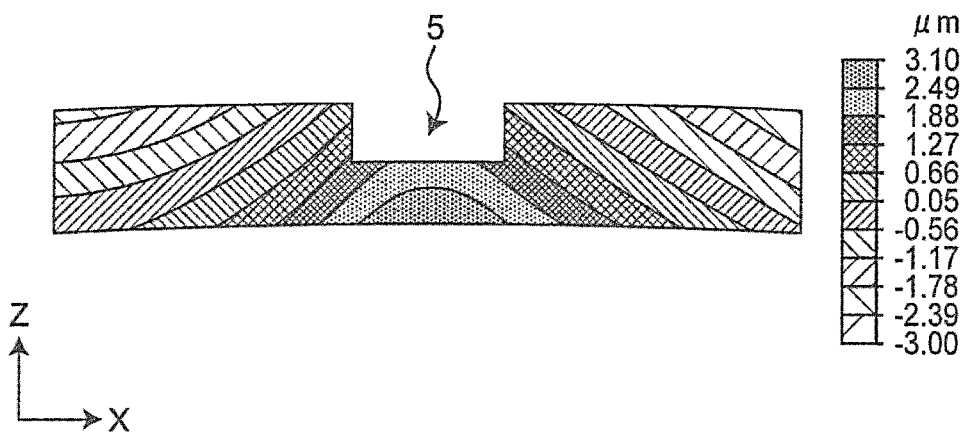
FIG. 3B shows a distribution of compressive stress values to simulate warpage during thermal oxidation under conditions where the thickness $d3$ of the silicon oxide film on the second surface is greater than or equal to the thickness $d1$ of the silicon oxide film on the first surface, and the thickness $d2$ of the silicon oxide film on the bottom of the cavity is greater than the thickness $d1$ of the silicon oxide film on the first surface.

FIG. 3A shows a distribution of compressive stress values to simulate warpage during thermal oxidation under conditions where the thickness d3 of the silicon oxide film on the second surface is greater than or equal to the thickness d1 of the silicon oxide film on the first surface, and the thickness d2 of the silicon oxide film on the bottom of the cavity 5 is equal to the thickness d1 of the silicon oxide film on the first surface. FIG. 3B shows a distribution of compressive stress values to simulate warpage during thermal oxidation under conditions where the thickness d3 of the silicon oxide film on the second surface is greater than or equal to the thickness d1 of the silicon oxide film on the first surface, and the thickness d2 of the silicon oxide film on the bottom of the cavity 5 is greater than the thickness d1 of the silicon oxide film on the first surface.

FIG. 3A and FIG. 3B both illustrate cases where the relation d3≥d1 is satisfied by d1=2 µm and d3=2 µm. FIG. 3A illustrates how compressive stress values are distributed when the relation d1=d2 is satisfied by d2=2 µm. As shown, the silicon substrate having a cavity curves upward at one end in this case. FIG. 3B illustrates how compressive stress values are distributed when the relation d1<d2 is satisfied by d2=3 µm. In this case, warpage of the silicon substrate having a cavity is smaller than that in FIG. 3A.

Figure 4A:
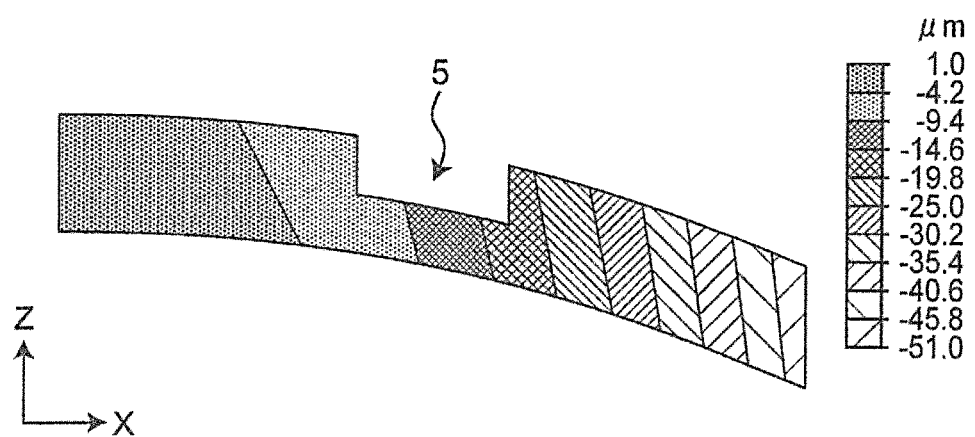
FIG. 4A shows a distribution of compressive stress values to simulate warpage during thermal oxidation under conditions where the thickness $d3$ of the silicon oxide film on the second surface is smaller than the thickness $d1$ of the silicon oxide film on the first surface, and the thickness $d2$ of the silicon oxide film on the bottom of the cavity is equal to the thickness $d1$ of the silicon oxide film on the first surface.
Figure 4B:
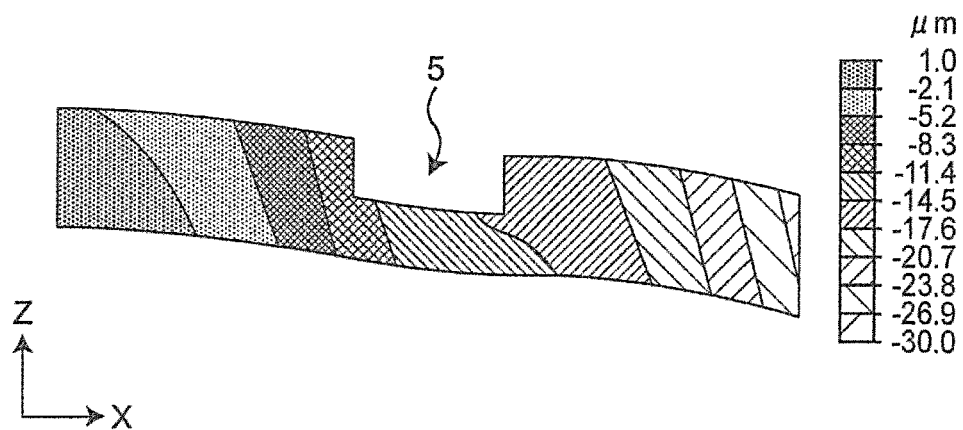
FIG. 4B shows a distribution of compressive stress values to simulate warpage during thermal oxidation under conditions where the thickness d3 of the silicon oxide film on the second surface is smaller than the thickness d1 of the silicon oxide film on the first surface, and the thickness d2 of the silicon oxide film on the bottom of the cavity is smaller than the thickness d1 of the silicon oxide film on the first surface.

FIG. 4A shows a distribution of compressive stress values to simulate warpage during thermal oxidation under conditions where the thickness d3 of the silicon oxide film on the second surface is smaller than the thickness d1 of the silicon oxide film on the first surface, and the thickness d2 of the silicon oxide film on the bottom of the cavity 5 is equal to the thickness d1 of the silicon oxide film on the first surface. FIG. 4B shows a distribution of compressive stress values to simulate warpage during thermal oxidation under conditions where the thickness d3 of the silicon oxide film on the second surface is smaller than the thickness d1 of the silicon oxide film on the first surface, and the thickness d2 of the silicon oxide film on the bottom of the cavity 5 is smaller than the thickness d1 of the silicon oxide film on the first surface.

FIG. 4A and FIG. 4B both illustrate cases where the relation d3<d1 is satisfied by d1=3 µm and d3=2 µm. FIG. 4A illustrates how compressive stress values are distributed when the relation d1=d2 is satisfied by d2=3 µm. As shown, the silicon substrate having a cavity curves downward at one end in this case. FIG. 4B illustrates how compressive stress values are distributed when the relation d1>d2 is satisfied by d2=1 µm. In this case, warpage of the silicon substrate having a cavity is smaller than that in FIG. 4A.

If the thickness d1 of the silicon oxide film on the first surface, the thickness d2 of the silicon oxide film on the bottom of the cavity 5, and the thickness d3 of the silicon oxide film on the second surface satisfy the relation d1=d2 as well as the relation d3≥d1, then the silicon substrate having a cavity curves upward at one end. Also, if the relation d1=d2 is satisfied as well as the relation d3<d1, then the silicon substrate having a cavity curves downward at one end. This is probably because although d1=d3 basically means the same warpage, a difference between d1 and d3 creates corresponding warpage. That is, if the relation d3>d1 is satisfied, where d3 is greater, the amount of compressive stress in the silicon oxide film on the second surface is greater than the amount of compressive stress in the silicon oxide film on the first surface, and thus the silicon substrate having a cavity curves upward at one end.

If the relation d1<d2, as well as the relation d3 d1, is satisfied, warpage of the silicon substrate having a cavity is reduced. Also, if the relation d1>d2, as well as the relation d3<d1, is satisfied, warpage of the silicon substrate having a cavity is reduced. This is probably because, by varying the value of d2, stress produced between Si of the silicon substrate and $SiO_2$ of the silicon oxide film is relieved. The magnitude of warpage of the silicon substrate is determined by the relation between the thickness of the $SiO_2$ oxide film on the first surface and the thickness of the $SiO_2$ oxide film on the second surface. Varying the relation between d1 and d2 changes the relation with respect to d3. This probably leads to reduced stress under the conditions of FIG. 3A to FIG. 4B, and eventually leads to reduced warpage of the silicon substrate having a cavity.

The present inventor has thus been led to the present invention where a silicon substrate having a cavity is configured such that the thickness d1 of the silicon oxide film on the first surface of the silicon substrate, the thickness d2 of the silicon oxide film on the bottom of the cavity 5, and the thickness d3 of the silicon oxide film on the second surface of the silicon substrate satisfy a predetermined relation, so that warpage of the silicon substrate having a cavity is reduced.

Hereinafter, a silicon substrate having a cavity and a cavity SOI substrate, according to embodiments, will be described with reference to the accompanying drawings. Throughout the drawings, substantially the same components are assigned the same reference signs.

First Embodiment

<Silicon Substrate Having Cavity>

Figure 1A:
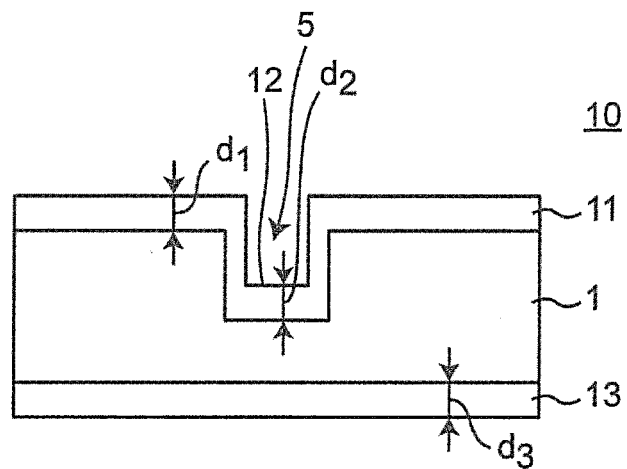
FIG. 1A is a schematic cross-sectional view illustrating a cross-sectional configuration of a silicon substrate having a cavity according to a first embodiment.

FIG. 1A is a schematic cross-sectional view illustrating a cross-sectional configuration of a silicon substrate 10 having a cavity 5 according to a first embodiment. The silicon substrate 10 has a first silicon substrate 1 with a first surface with the cavity 5, and a second surface opposite the first surface. The silicon substrate 10 includes a first silicon oxide film 11 disposed on the first surface except the cavity 5, a second silicon oxide film 12 disposed on a bottom of the cavity 5, and a third silicon oxide film 13 disposed on the second surface. The silicon substrate 10 is configured such that a thickness d1 of the first silicon oxide film 11, a thickness d2 of the second silicon oxide film 12, and a thickness d3 of the third silicon oxide film 13 satisfy a first set of relations, d1≤d3 and d1<d2, or a second set of relations, d3<d1 and d2<d1.

That is, the thickness d1 of the first silicon oxide film 11 on the first surface, the thickness d2 of the second silicon oxide film 12 on the bottom of the cavity 5, and the thickness d3 of the third silicon oxide film 13 on the second surface are determined so as to satisfy the first set of relations or the second set of relations, so that the occurrence of warpage in the silicon substrate 10 having the cavity 5 is reduced.

<Cavity SOI Substrate>

Figure 1B:
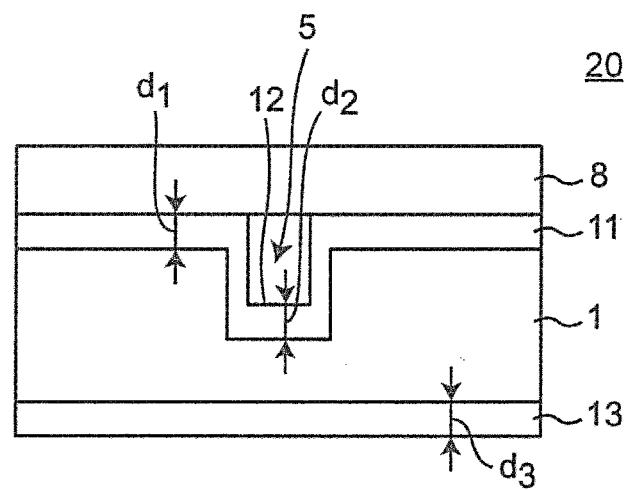
FIG. 1B is a schematic cross-sectional view illustrating a cross-sectional configuration of a cavity SOI substrate according to the first embodiment.

FIG. 1B is a schematic cross-sectional view illustrating a cross-sectional configuration of a cavity SOI substrate 20 according to the first embodiment. The cavity SOI substrate 20 includes a first silicon substrate 1 and a second silicon substrate 8. The first silicon substrate 1 has the first surface with the cavity 5, and the second surface opposite the first surface. The first silicon substrate 1 includes the first silicon oxide film 11 disposed on the first surface except the cavity 5, the second silicon oxide film 12 disposed on the bottom of the cavity 5, and the third silicon oxide film 13 disposed on the second surface. The second silicon substrate 8 is bonded to the first surface of the first silicon substrate 1 (via the first silicon oxide film 11). The first silicon substrate 1 is configured such that the thickness d1 of the first silicon oxide film 11, the thickness d2 of the second silicon oxide film 12, and the thickness d3 of the third silicon oxide film 13 satisfy the first set of relations, d1≤d3 and d1<d2, or the second set of relations, d3<d1 and d2<d1.

That is, the thickness d1 of the first silicon oxide film 11 on the first surface of the first silicon substrate 1, the thickness d2 of the second silicon oxide film 12 on the bottom of the cavity 5, and the thickness d3 of the third silicon oxide film 13 on the second surface of the first silicon substrate 1 are determined so as to satisfy the first set of relations or the second set of relations, so that the occurrence of warpage in the cavity SOI substrate 20 is reduced.

Components of the cavity SOI substrate 20 will now be described.

<First Silicon Substrate>

The silicon substrate 10 having the cavity 5 may be used as the first silicon substrate 1 in the second embodiment of FIG. 1B.

<Second Silicon Substrate>

The second silicon substrate 8 differs from the first silicon substrate 1 in that it has no cavity. The second silicon substrate 8 is bonded to the first silicon substrate 1 (via the first silicon oxide film 11). For example, the second silicon substrate 8 may be directly bonded to the first silicon substrate 1 using a process called fusion bonding (described below). The bonding technique is not limited to this.

<Method for Manufacturing Cavity SOI Substrate>

Figure 5B:
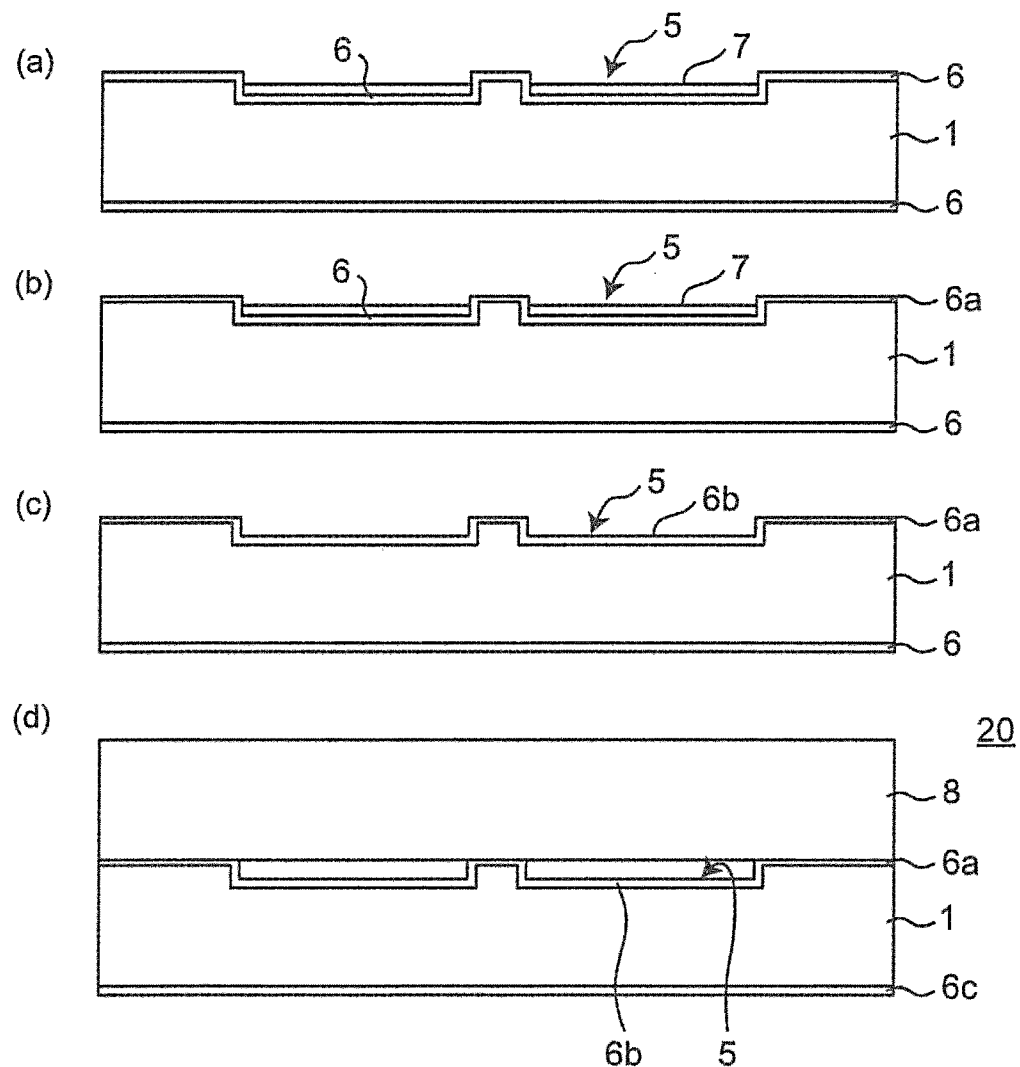
FIG. 5B is a schematic cross-sectional view illustrating the subsequent steps of the method for manufacturing the cavity SOI substrate according to the first embodiment.

FIG. 5A and FIG. 5B are schematic cross-sectional views illustrating steps of a method for manufacturing the cavity SOI substrate including the silicon substrate having a cavity, according to the first embodiment.

(1) The first silicon substrate 1 is prepared (FIG. 5A(a)).

(2) The first silicon substrate 1 is thermally oxidized (FIG. 5A(b)). This produces silicon oxide films 2a and 2b (i.e., thermal oxide films) on the first surface and the second surface, respectively, of the first silicon substrate 1.

(3) A resist pattern 3 is formed on the silicon oxide film 2a using photolithography (FIG. 5A(c)). The resist pattern 3 is formed over the silicon oxide film 2a, except an opening 4 that is a region where the cavity 5 is to be formed. For example, a resist, such as a photo-curable film, is formed over the entire surface of the silicon oxide film 2a. Then, a part of the resist located in the opening 4, where the cavity 5 is to be formed, is removed by patterning which involves selective light irradiation, so that the resist pattern 3 is obtained.

(4) A part of the silicon oxide film 2a not covered with the resist pattern 3 is removed, together with the silicon oxide film 2b, by wet etching (FIG. 5A(d)). The wet etching may be performed using hydrofluoric acid or buffered hydrogen fluoride (BHF), or dry etching may be performed. Thus, only part of the silicon oxide film 2a covered with the resist pattern 3 is left unremoved, and the first silicon substrate 1 is exposed in the opening 4.

(5) The resist pattern 3 is removed, for example, by ashing or using a resist peeling liquid (FIG. 5A(e)).

(6) The cavity 5 is formed in the first surface of the first silicon substrate 1 by deep reactive-ion etching (DRIE) (FIG. 5A(f)). The silicon oxide film 2a remaining on the first surface serves as a mask to allow the cavity 5 to be formed in the opening 4.

(7) The silicon oxide film 2a is removed by wet etching which involves using hydrofluoric acid or BHF (FIG. 5A(g)).

(8) The first silicon substrate 1 is thermally oxidized. This produces a silicon oxide film 6 for fusion bonding on the first silicon substrate 1 (FIG. 5A(h)). The silicon oxide film 6 formed on the first silicon substrate 1 has a thickness d. That is, at this point, the silicon oxide film 6 on the first surface, the silicon oxide film 6 on the bottom of the cavity 5, and the silicon oxide film 6 on the second surface have substantially the same film thickness d.

(9) A resist pattern 7 is formed in the cavity 5 (FIG. 5B(a)). The resist pattern 7 is not formed outside the cavity 5. That is, the first surface and the second surface of the first silicon substrate 1 do not have the resist pattern 7 thereon.

(10) The silicon oxide film 6 on the first surface and the second surface of the first silicon substrate 1 is partially removed by appropriate etching. The thickness of a silicon oxide film 6a on the first surface of the first silicon substrate 1 is defined as d1, and the thickness of a silicon oxide film 6c on the second surface of the first silicon substrate 1 is defined as d3 (FIG. 5B(b)). The silicon oxide film 6a corresponds to the first silicon oxide film 11, and the silicon oxide film 6c corresponds to the third silicon oxide film 13.

(11) The resist pattern 7 is peeled off (FIG. 5B(c)). The first silicon substrate 1 having the cavity 5 is thus obtained by this process. At this point, the thickness d3 of the silicon oxide film 6c is substantially the same as the thickness d1 of the silicon oxide film 6a (d3=d1). A silicon oxide film 6b is formed on the bottom of the cavity 5. The silicon oxide film 6b corresponds to the second silicon oxide film 12.

To obtain the silicon substrate 10 having the cavity 5, it is necessary to adjust the thickness d1 of the first silicon oxide film 11 on the first surface of the first silicon substrate 1, the thickness d2 of the second silicon oxide film 12 on the bottom of the cavity 5, and the thickness d3 of the third silicon oxide film 13 on the second surface of the first silicon substrate 1 in such a way that they satisfy the first set of relations, d1≤d3 and d1<d2. To make this adjustment, the method for manufacturing the cavity SOI substrate performs annealing after bonding of the first silicon substrate 1 and second silicon substrate 8, so as to increase the thickness d3 of the silicon oxide film 6c on the second surface. The present invention is not limited to this. For example, the step of peeling off the resist pattern 7 may be followed by covering the first surface with a resist pattern and annealing, so as to increase the thickness d3 of the silicon oxide film 6c on the second surface. Alternatively, the silicon oxide film 6c on the second surface may be ground, so as to reduce the thickness d3 of the silicon oxide film 6c on the second surface.

(12) The first silicon substrate 1 having the cavity 5, obtained by the process described above, and the second silicon substrate 8, are appropriately cleaned together. Then, after activation treatment, the first silicon substrate 1 having the cavity 5 and the second silicon substrate 8 are fusion-bonded together.

For example, the fusion bonding is performed by the following steps.

a) At least the first surface of the first silicon substrate 1 or the bonding surface of the second silicon substrate 8 is made hydrophilic to form a film of water.

b) The first surface of the first silicon substrate 1 and the bonding surface of the second silicon substrate 8 are pre-bonded together by force of water on the surfaces.

c) The first silicon substrate 1 and the second silicon substrate 8 are heated while being in the pre-bonded state.

d) At around 200° C., water and oxygen begin to be released from the interface between the first surface of the first silicon substrate 1 and the bonding surface of the second silicon substrate 8. The interfacial bonding thus transitions to hydrogen bonding. This enhances the bonding strength between the first surface of the first silicon substrate 1 and the bonding surface of the second silicon substrate 8.

e) Up to around 600° C., water and oxygen continue to be released and this increases voids in the interface between the first surface of the first silicon substrate 1 and the bonding surface of the second silicon substrate 8.

f) At a temperature of about 1000° C., water and oxygen diffuse into Si in the interface between the first surface of the first silicon substrate 1 and the bonding surface of the second silicon substrate 8 and the voids disappear. This further enhances the bonding strength between the first surface of the first silicon substrate 1 and the bonding surface of the second silicon substrate 8.

The direct bonding of the first silicon substrate 1 and the second silicon substrate 8 is thus completed. The process is not limited to that described above, and any process that enables direct bonding may be used.

(13) Next, annealing is performed in an atmosphere containing oxygen at 1000° C. to enhance the bonding strength between the first surface of the first silicon substrate 1 and the bonding surface of the second silicon substrate 8, so that the cavity SOI substrate 20 is obtained (FIG. 5B(d)).

The thickness d3 of the silicon oxide film 6c on the second surface of the first silicon substrate 1 increases and satisfies the relation d3>d1. For example, if annealing is performed in a $N_2$ atmosphere, the thickness d3 does not increase and the relation d3=d1 stays the same. The cavity SOI substrate 20 with less warpage is then obtained. The thicknesses d1, d2, and d3 thus have a relation that satisfies d3≥d1 and d1<d2.

That is, when the thickness d3 of the silicon oxide film 6c on the second surface of the first silicon substrate 1 is equal or greater than the thickness d1 of the silicon oxide film 6a on the first surface of the first silicon substrate 1 (d3≥d1), the first silicon substrate 1 curves upward at either end. The cavity SOI substrate 20 according to the first embodiment is thus configured such that the thickness d2 of the silicon oxide film 6b on the bottom of the cavity 5 of the first silicon substrate 1 is greater than the thickness d1 of the silicon oxide film 6a on the first surface of the first silicon substrate 1, so that the relation d1<d2 is satisfied. This reduces warpage in the silicon substrate 10 having a cavity and the cavity SOI substrate 20 including the silicon substrate 10.

Second Embodiment

<Method for Manufacturing Cavity SOI Substrate>

A method for manufacturing a cavity SOI substrate 20a according to a second embodiment differs from the method for manufacturing the cavity SOI substrate 20 according to the first embodiment in that the thickness d3 of the silicon oxide film 6c on the second surface of the first silicon substrate 1 is smaller than the thickness d1 of the silicon oxide film 6a on the first surface of the first silicon substrate 1 (d3<d1).

The method for manufacturing the cavity SOI substrate 20a according to the second embodiment is characterized in that the thickness d1 of the silicon oxide film 6a on the first surface and the thickness d2 of the silicon oxide film 6b on the bottom of the cavity 5 satisfy the relation d1>d2. This reduces warpage in the cavity SOI substrate 20a.

Figure 6A:
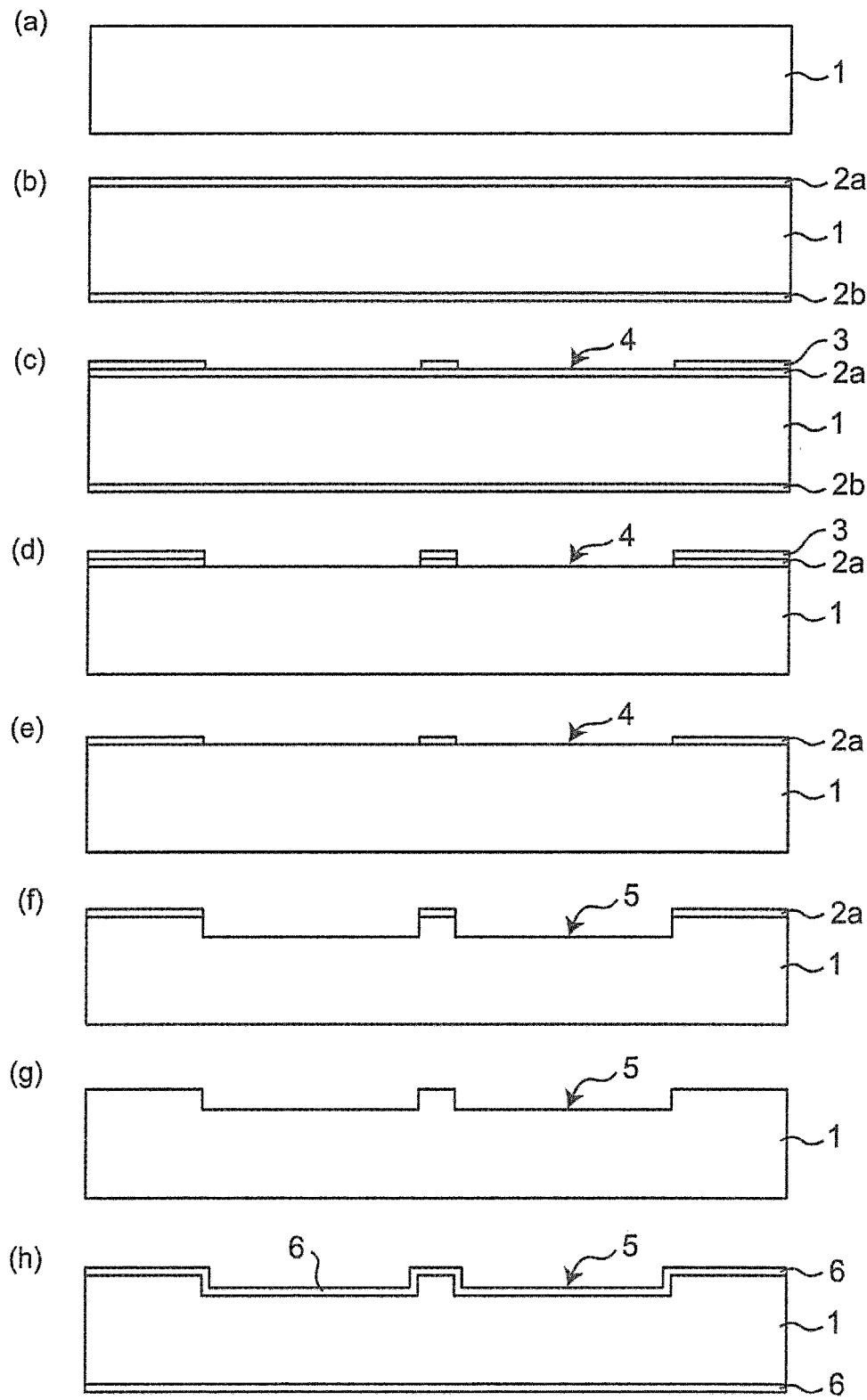
FIG. 6A is a schematic cross-sectional view illustrating steps of a method for manufacturing a cavity SOI substrate according to a second embodiment.
Figure 6B:
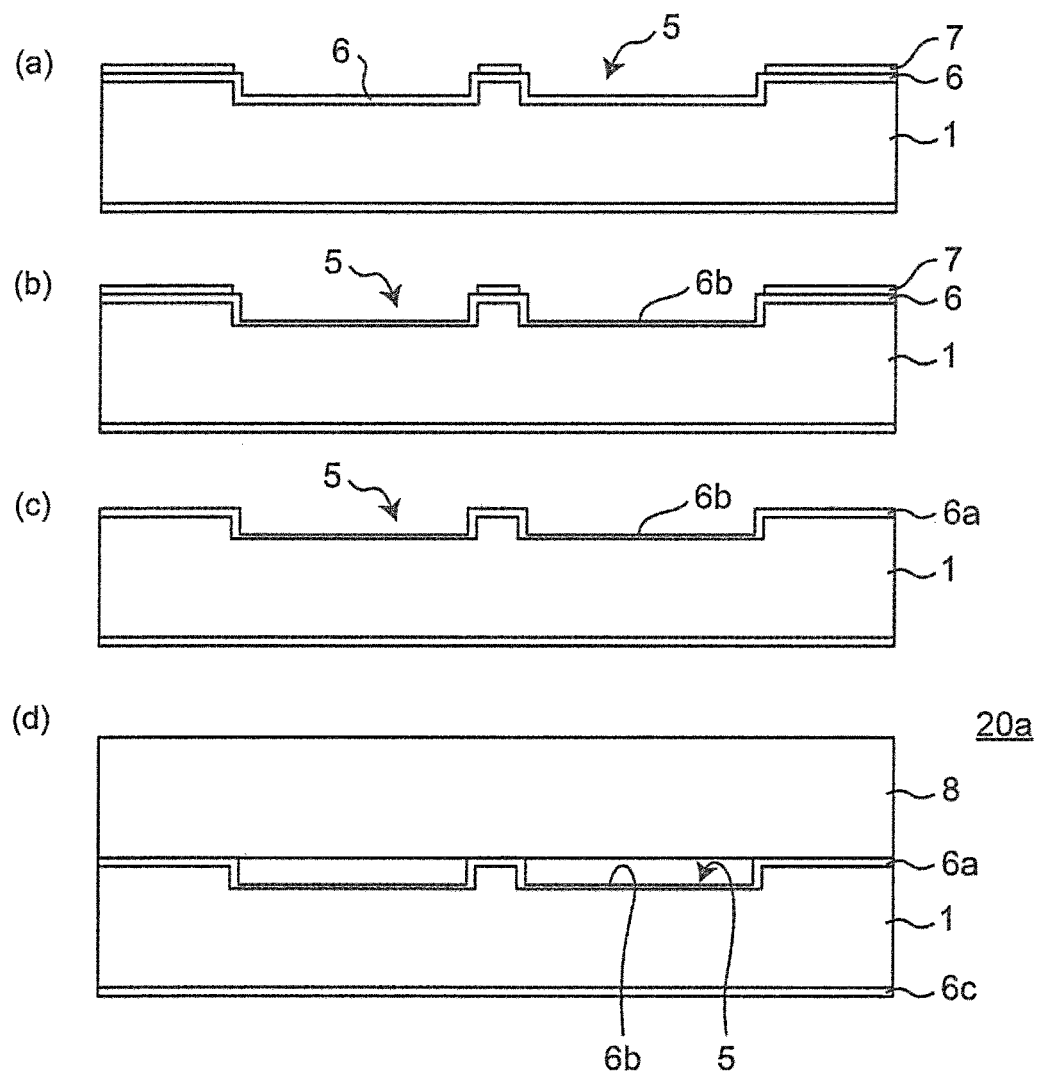
FIG. 6B is a schematic cross-sectional view illustrating the subsequent steps of the method for manufacturing the cavity SOI substrate according to the second embodiment.

FIG. 6A and FIG. 6B are schematic cross-sectional views illustrating steps of the method for manufacturing the cavity SOI substrate 20a including the silicon substrate having a cavity, according to the second embodiment.

(1) The first silicon substrate 1 is prepared (FIG. 6A(a)).

(2) The first silicon substrate 1 is thermally oxidized (FIG. 6A(b)). This produces the silicon oxide films 2a and 2b (i.e., thermal oxide films) on the first surface and the second surface, respectively, of the first silicon substrate 1.

(3) The resist pattern 3 is formed on the silicon oxide film 2a using photolithography (FIG. 6A(c)). The resist pattern 3 is formed over the silicon oxide film 2a, except the opening 4 that is a region where the cavity 5 is to be formed. For example, a resist, such as a photo-curable film, is formed over the entire surface of the silicon oxide film 2a. Then, a part of the resist located in the opening 4, where the cavity 5 is to be formed, is removed by patterning which involves selective light irradiation, so that the resist pattern 3 is obtained.

(4) A part of the silicon oxide film 2a not covered with the resist pattern 3 is removed, together with the silicon oxide film 2b, by wet etching (FIG. 6A(d)). The wet etching may be performed using hydrofluoric acid or buffered hydrogen fluoride (BHF), or dry etching may be performed. Thus, only part of the silicon oxide film 2a covered with the resist pattern 3 is left unremoved, and the first silicon substrate 1 is exposed in the opening 4, where the cavity 5 is to be formed.

(5) The resist pattern 3 is removed, for example, by ashing or using a resist peeling liquid (FIG. 6A(e)).

(6) The cavity 5 is formed in the first surface of the first silicon substrate 1 by deep reactive-ion etching (DRIE) (FIG. 6A(f)). The silicon oxide film 2a remaining on the first surface serves as a mask to allow the cavity 5 to be formed in the opening 4.

(7) The silicon oxide film 2a is removed by wet etching which involves using hydrofluoric acid or BHF (FIG. 6A(g)).

(8) The first silicon substrate 1 is thermally oxidized. This produces the silicon oxide film 6 for fusion bonding on the first silicon substrate 1 (FIG. 6A(h)). The silicon oxide film 6 formed on the first silicon substrate 1 has a thickness d. That is, at this point, the silicon oxide film 6 on the first surface, the silicon oxide film 6 on the bottom of the cavity 5, and the silicon oxide film 6 on the second surface have substantially the same film thickness d.

(9) The resist pattern 7 is formed on the first surface of the first silicon substrate 1 (FIG. 6B(a)). Unlike the first embodiment, the resist pattern 7 is formed neither in the cavity 5 nor on the second surface of the first silicon substrate 1.

(10) The silicon oxide film 6 on the bottom of the cavity 5 and the second surface is partially removed by appropriate etching. The thickness of the silicon oxide film 6b on the bottom of the cavity 5 of the first silicon substrate 1 is defined as d2, and the thickness of the silicon oxide film 6c on the second surface of the first silicon substrate 1 is defined as d3 (FIG. 6B(b)). The silicon oxide film 6b corresponds to the second silicon oxide film 12, and the silicon oxide film 6c corresponds to the third silicon oxide film 13.

(11) The resist pattern 7 is peeled off (FIG. 6B(c)). The first silicon substrate 1 having the cavity 5 is thus obtained by this process. At this point, the thickness d3 of the silicon oxide film 6c is substantially the same as the thickness d2 of the silicon oxide film 6b on the bottom of the cavity 5 (d3=d2). The silicon oxide film 6a corresponds to the first silicon oxide film 11.

Then, as in the first embodiment, the thickness d3 of the silicon oxide film 6c on the second surface is adjusted in such a way that the thickness d1 of the first silicon oxide film 11 on the first surface of the first silicon substrate 1, the thickness d2 of the second silicon oxide film 12 on the bottom of the cavity 5, and the thickness d3 of the third silicon oxide film 13 on the second surface of the first silicon substrate 1 satisfy the second set of relations, d3<d1 and d2<d1.

(12) The first silicon substrate 1 having the cavity 5, obtained by the process described above, and the second silicon substrate 8, are appropriately cleaned together. Then, after activation treatment, the first silicon substrate 1 having the cavity 5 and the second silicon substrate 8 are fusion-bonded together.

(13) Next, annealing is performed in an atmosphere containing oxygen at 1000° C. to enhance the bonding strength between the first surface of the first silicon substrate 1 and the bonding surface of the second silicon substrate 8, so that the cavity SOI substrate 20a is obtained (FIG. 6B(d)).

The thickness d3 of the silicon oxide film 6c on the second surface of the first silicon substrate 1 increases and satisfies the relation d3>d2. For example, if annealing is performed in a $N_2$ atmosphere, the thickness d3 does not increase and the relation d3=d2 stays the same.

It is only necessary here that the atmosphere for annealing be selected in such a way that the film thickness d1 of the silicon oxide film 6a on the first surface, the film thickness d2 of the silicon oxide film 6b on the cavity 5, and the film thickness d3 of the silicon oxide film 6c on the second surface satisfy a set of relations d3<d1 and d2<d1. The cavity SOI substrate 20a with less warpage is then obtained. The thicknesses d1, d2, and d3 thus have a relation satisfying d3<d1 and d2<d1.

That is, when the thickness d3 of the silicon oxide film 6c on the second surface of the first silicon substrate 1 is smaller than the thickness d1 of the silicon oxide film 6a on the first surface of the first silicon substrate 1 (d3<d1), the first silicon substrate 1 curves downward at either end. The cavity SOI substrate 20a according to the second embodiment is thus configured such that the thickness d2 of the silicon oxide film 6b on the bottom of the cavity 5 of the first silicon substrate 1 is smaller than the thickness d1 of the silicon oxide film 6a on the first surface of the first silicon substrate 1, so that the relation d2<d1 is satisfied. This reduces warpage in the silicon substrate having a cavity and the cavity SOI substrate 20a including the silicon substrate.

The present disclosure includes appropriate combinations of any of the various embodiments and/or examples described above, and achieves effects of the corresponding embodiments and/or examples.

In the silicon substrate having a cavity and the cavity SOI substrate including the silicon substrate according to the present invention, the thicknesses d1, d2, and d3 satisfy a first set of relations, d1≤d3 and d1<d2, or a second set of relations, d3<d1 and d2<d1. This reduces warpage in the silicon substrate having a cavity and the cavity SOI substrate including the silicon substrate.

REFERENCE SIGNS LIST

1: first silicon substrate
5: cavity
8: second silicon substrate
10: silicon substrate having a cavity (first silicon substrate)
11: first silicon oxide film
12: second silicon oxide film
13: third silicon oxide film
20: cavity SOI substrate

The invention claimed is:

1. A silicon substrate comprising:
a first silicon substrate having a first surface with a cavity and a second surface opposite the first surface;
a first silicon oxide film having a thickness d1 on the first surface;
a second silicon oxide film having a thickness d2 on a bottom of the cavity; and
a third silicon oxide film having a thickness d3 on the second surface,
wherein d1≤d3 and d1<d2.

2. A cavity SOI substrate comprising:
a first silicon substrate having a first surface with a cavity and a second surface opposite the first surface;
a first silicon oxide film having a thickness d1 on the first surface;
a second silicon oxide film having a thickness d2 on a bottom of the cavity;
a third silicon oxide film having a thickness d3 on the second surface; and
a second silicon substrate bonded to the first silicon substrate such that the first silicon oxide film is between the first silicon substrate and the second silicon substrate,
wherein d1≤d3 and d1<d2.

* * * * *